(12) United States Patent
Ou Yang et al.

(10) Patent No.: US 10,649,512 B2
(45) Date of Patent: May 12, 2020

(54) HIGH EFFICIENT BATTERY BACKUP SYSTEM

(71) Applicant: QUANTA COMPUTER INC., Taoyuan (TW)

(72) Inventors: Kuang-Hua Ou Yang, Taoyuan (TW); Wen-Kai Lee, Taoyuan (TW); Chin-Hsiang Chan, Taoyuan (TW); Shu-Chen Ning, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 363 days.

(21) Appl. No.: 15/659,108

(22) Filed: Jul. 25, 2017

(65) Prior Publication Data
US 2019/0033938 A1 Jan. 31, 2019

(51) Int. Cl.
| | |
|---|---|
| G06F 1/26 | (2006.01) |
| G06F 1/32 | (2019.01) |
| H02J 7/04 | (2006.01) |
| G06F 1/30 | (2006.01) |
| H02J 7/00 | (2006.01) |
| H02J 9/06 | (2006.01) |
| G06F 1/3287 | (2019.01) |
| G06F 1/3296 | (2019.01) |
| G01R 19/165 | (2006.01) |

(52) U.S. Cl.
CPC .............. *G06F 1/263* (2013.01); *G06F 1/26* (2013.01); *G06F 1/266* (2013.01); *G06F 1/30* (2013.01); *G06F 1/32* (2013.01); *G06F 1/3287* (2013.01); *G06F 1/3296* (2013.01); *H02J 7/007* (2013.01); *H02J 7/0077* (2013.01); *H02J 7/04* (2013.01); *H02J 7/045* (2013.01); *H02J 9/062* (2013.01); *G01R 19/16542* (2013.01)

(58) Field of Classification Search
None
See application file for complete search history.

(56) References Cited

U.S. PATENT DOCUMENTS

| 9,733,687 B2 | 8/2017 | Lee et al. |
| 2007/0040449 A1 | 2/2007 | Spurlin et al. |

(Continued)

FOREIGN PATENT DOCUMENTS

| CN | 1279176 A | 1/2001 |
| CN | 1897395 A | 1/2007 |

(Continued)

OTHER PUBLICATIONS

Extended European Search Report for EP Application No. 17195889.5, dated May 8, 2018.

(Continued)

*Primary Examiner* — Tanh Q Nguyen
(74) *Attorney, Agent, or Firm* — Nixon Peabody LLP; Zhou Lu (57) ABSTRACT

Various examples of the present disclosure provide a high efficient battery system, and systems and methods for intelligently discharging and charging the battery system such that an output voltage of the battery system is maintained within a predetermined voltage range. In some examples, a base board controller (BMC) is used to manage charging and discharging of the battery system. The BMC can provide both over-charging protection and over-discharging protection for the battery system.

16 Claims, 5 Drawing Sheets

(56) References Cited

U.S. PATENT DOCUMENTS

| | | | |
|---|---|---|---|
| 2009/0297893 A1* | 12/2009 | Ito | H01M 8/04567 429/9 |
| 2011/0016340 A1* | 1/2011 | Sun | G06F 1/30 713/340 |
| 2013/0030735 A1 | 1/2013 | Jau et al. | |
| 2013/0031381 A1* | 1/2013 | Jau | G06F 1/305 713/300 |
| 2013/0159735 A1 | 6/2013 | Hou et al. | |
| 2015/0076910 A1* | 3/2015 | Wang | H02M 3/156 307/52 |
| 2015/0331468 A1* | 11/2015 | Jau | G06F 1/3287 713/323 |
| 2016/0053765 A1 | 2/2016 | Schreiber et al. | |
| 2019/0033938 A1* | 1/2019 | Ou Yang | G06F 1/30 |
| 2019/0036377 A1* | 1/2019 | Ou Yang | G06F 1/263 |

FOREIGN PATENT DOCUMENTS

| | | |
|---|---|---|
| CN | 102902339 A | 1/2013 |
| CN | 102902340 A | 1/2013 |
| CN | 105912448 A | 8/2016 |
| CN | 106095034 A | 11/2016 |
| CN | 106155260 A | 11/2016 |
| CN | 106328179 A | 1/2017 |
| JP | S62-012338 | 1/1987 |
| JP | 2004-064975 A | 2/2004 |
| JP | 2004-159405 A | 6/2004 |
| JP | 2013-132132 A | 7/2013 |
| JP | 2013132132 A | 7/2013 |
| JP | 2013-164783 A | 8/2013 |
| JP | 2013164783 A | 8/2013 |
| JP | 2013-186780 A | 9/2013 |
| JP | 2013186780 A | 9/2013 |

OTHER PUBLICATIONS

CN Search Report for Application No. 201710958893.4, dated Dec. 3, 2019, w/ First Office Action.

\* cited by examiner

HIGH EFFICIENT BATTERY BACKUP SYSTEM

TECHNICAL FIELD

The present disclosure relates generally to a server system.

BACKGROUND

Modern server farms or datacenters typically employ a large number of servers to handle processing needs for a variety of application services. Each server handles various operations and requires a certain level of power consumption to maintain these operations. Some of these operations are "mission critical" operations, interruptions to which may lead to significant security breach or revenue losses for users associated with these operations.

However, interruptions of an AC power to datacenters can be unpredictable. In some cases, power interruptions can force a sudden shutdown and/or possibly resulting in data losses. Datacenters typically have back-up powers (e.g., energy stored in batteries) to support power consumption during AC power interruptions. The sudden shutdown can be prevented if a datacenter maintains a certain level of backup power before an input power interruption occurs. However, it remains a challenge to improve efficiencies and reliability of back-up powers.

SUMMARY

Systems and methods in accordance with various examples of the present disclosure provide a high efficient battery system and a solution to the above-mentioned problems by intelligently discharging and charging the battery system such that an output voltage of the battery system is maintained within a predetermined voltage range. More specifically, various examples of the present disclosure provide systems and methods for managing charging and discharging of the battery system using a base board controller (BMC) of the server system.

In some examples, the BMC is connected to the battery system via a communication interface. The BMC is also coupled to a power supply unit (PSU) of the server system. In response to receiving a power failure signal from the PSU, the BMC can enable the battery system to discharge power to the server system. The power failure signal can indicate that either the PSU or an AC power supply to the PSU has failed.

In some examples, the BMC monitors status information of the PSU or the AC power supply to the PSU. In response to determining that either the PSU or the AC power supply has failed, the BMC generates a discharging-enable command to enable the battery system to discharge power to the server system. The BMC can further determine whether an output voltage of the battery system is above a predetermined low value. In an event the output voltage of the battery system is equal or below the predetermined low value, the BMC generates to discharging-disable command to disable the battery system from further discharging power to the server system.

In some examples, in an event that the PSU behaves abnormally (e.g., a short-term sag), the BMC can generate a discharging-enable command to enable the battery system to immediately discharge power to the server system. The battery system can supply power to the sever system to ensure that the server system operates with a stable power source.

In response to receiving an AC OK signal from the PSU, the BMC can generate a charging-enable command to enable the battery system to be charged by the PSU. The power ok signal indicates that both the PSU and an AC power supply to the PSU are okay. In some examples, the BMC monitors status information of the PSU or the AC power supply to the PSU. In response to determining that both the PSU and the AC power supply are ok, the BMC generates a charging-enable command to enable the battery system to be charged by the PSU. The BMC can further determine whether an output voltage of the battery system is below a threshold high value. In an event that the output voltage of the battery system is equal or higher than the threshold high value, the BMC generates a charging-disable command to disable the battery system from being further charged by the PSU.

In some examples, the battery system comprises a microcontroller unit (MCU), a battery charger, a battery pack, and an Oring MOSFET connected to a DC/DC converter of the server system. The battery charger is connected to an output of the PSU of the server system while the MCU is coupled to the BMC via the communication interface. The BMC can enable or disable charging and discharging of the battery system through the MCU and the communication interface.

In some examples, the BMC can receive status information of the battery system from the MCU through the communication interface. In an event that one of the PSU or the AC power supply has failed and an output voltage of the battery system is above the predetermined low value, the BMC sends a discharging-enable command to the MCU to enable the battery system to discharge power to the server system. In an event that one of the PSU or the AC power supply has failed and an output voltage of the battery system is equal or below the predetermined low value, the BMC sends a discharging-disable command to the MCU to disable the battery system from further discharging power to the server system.

BRIEF DESCRIPTION OF THE DRAWINGS

In order to describe the manner in which the above-recited and other advantages and features of the disclosure can be obtained, a more particular description of the principles briefly described above will be rendered by reference to specific examples thereof which are illustrated in the appended drawings. Understanding that these drawings depict only example aspects of the disclosure and are not therefore to be considered to be limiting of its scope, the principles herein are described and explained with additional specificity and detail through the use of the accompanying drawings in which.

DETAILED DESCRIPTION

The present disclosure can be embodied in many different forms. There are shown in the drawings, and will herein be described in detail, representative embodiments with the understanding that the present disclosure is to be considered as an exemplification or illustration of the principles of the present disclosure and is not intended to limit the broad aspects of the disclosure to the embodiments illustrated. To that extent, elements and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed: the singular includes the plural and vice versa; and the word "including" means "including without limitation." Moreover, words of approximation, such as "about," "almost," "substantially," "approximately," and the like, can be used herein in the sense of "at, near, or nearly at," or "within 3-5% of," or "within acceptable manufacturing tolerances," or any logical combination thereof, for example.

Various examples of the present disclosure provide systems and methods for intelligently discharging and charging a high efficient battery system such that an output voltage of the battery system is maintained within a predetermined voltage range. The battery system comprises a microcontroller unit (MCU), a battery charger, a battery pack, and an Oring MOSFET connected to a DC/DC converter of a server system. The battery charger is connected to an output of the PSU of the server system while the MCU is coupled to a BMC of the server system via the communication interface. The BMC manage charging and discharging of the battery system and also provide both over-charging protection and over-discharging protection for the battery system.

Figure 1A:
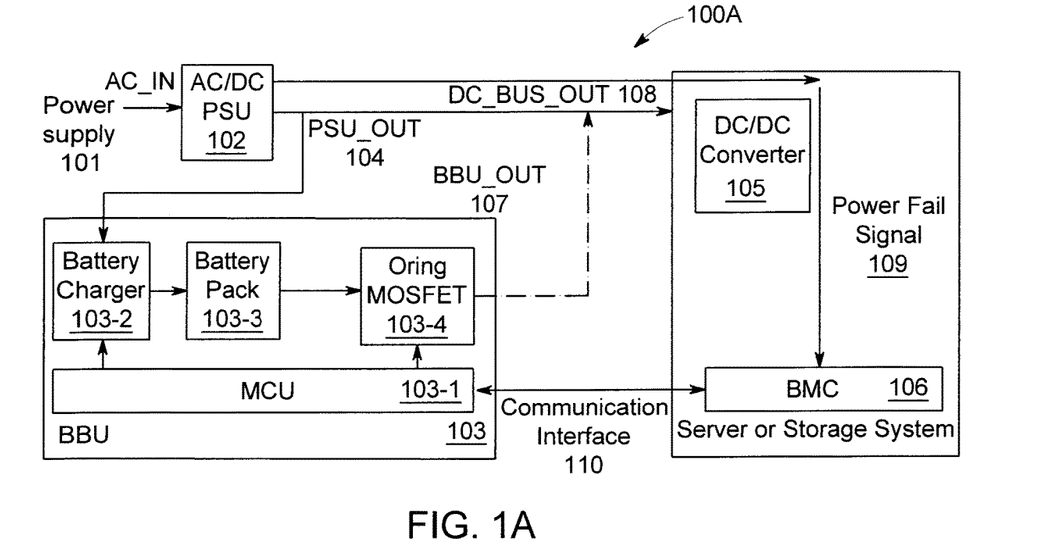
FIG. 1A is a schematic block diagram illustrating an exemplary high efficient battery backup (BBU) system, in accordance with an implementation of the present disclosure.

FIG. 1A is a schematic block diagram illustrating an exemplary high efficient battery backup unit (BBU) of a system 100A, in accordance with an implementation of the present disclosure. In this example, the system 100A comprises an AC/DC power supply unit (PSU) 102, a battery backup (BBU) system 103, a DC/DC converter 105, and a baseboard management controller 106. The PSU 102 is connected to an AC power supply 101 and configured to supply power to other components of the system 100A. The BBU system 103 comprises a microcontroller unit (MCU) 103-1, a battery charger 103-2, a battery pack 103-3, and an Oring MOSFET 103-4. The battery charger 103-2 is connected to a PSU_OUT 104 of the PSU 102 and the MCU 103-1. The Oring MOSFET 103-4 is directly connected to the battery pack 103-3 and the MCU 103-1, and also connected to the DC/DC converter 105.

The BMC 106 is coupled to the PSU 102 and connected to the MCU 103-1 via a communication interface 110. The BMC 106 is configured to receive from the PSU 102 status information of the power supply 101 and the PSU 102.

In response to determining that either the power supply 101 or the PSU 102 has failed, the BMC 106 can send a discharging-enable command via the communication interface 110 to the MCU 103-1 such that the BBU 103 can begin to discharge power to the DC/DC converter 105. The BMC 106 can further receive voltage information of the battery pack 103-3 from the MCU 103-1 via the communication interface 110. In response to determining that the voltage of the battery pack 103-3 has reached a threshold low value, the BMC 106 can send a discharging-disable command to the MCU 103-1 to stop further discharging power to the DC/DC converter 105. In some examples, the PSU 102 can directly send a power failure signal 109 to the BMC 106 in an event that either the power supply 101 or the PSU 102 has failed.

In response to determining that the power supply 101 and the PSU 102 are ok, the BMC 106 can send a charging-enable command to the MCU 103-1 via the communication interface 110 such that the battery charger 103-2 can receive power from the PSU_OUT 104 and start to charge the battery pack 103-3. The BMC 106 can further receive voltage information of the battery pack 103-3 from the MCU 103-1 via the communication interface 110. In response to determining that the voltage of the battery pack 103-3 has reached a threshold high value, the BMC 106 can send a charging-disable command to the MCU 103-1 to stop further charging power to the DC/DC converter 105.

Figure 1B:
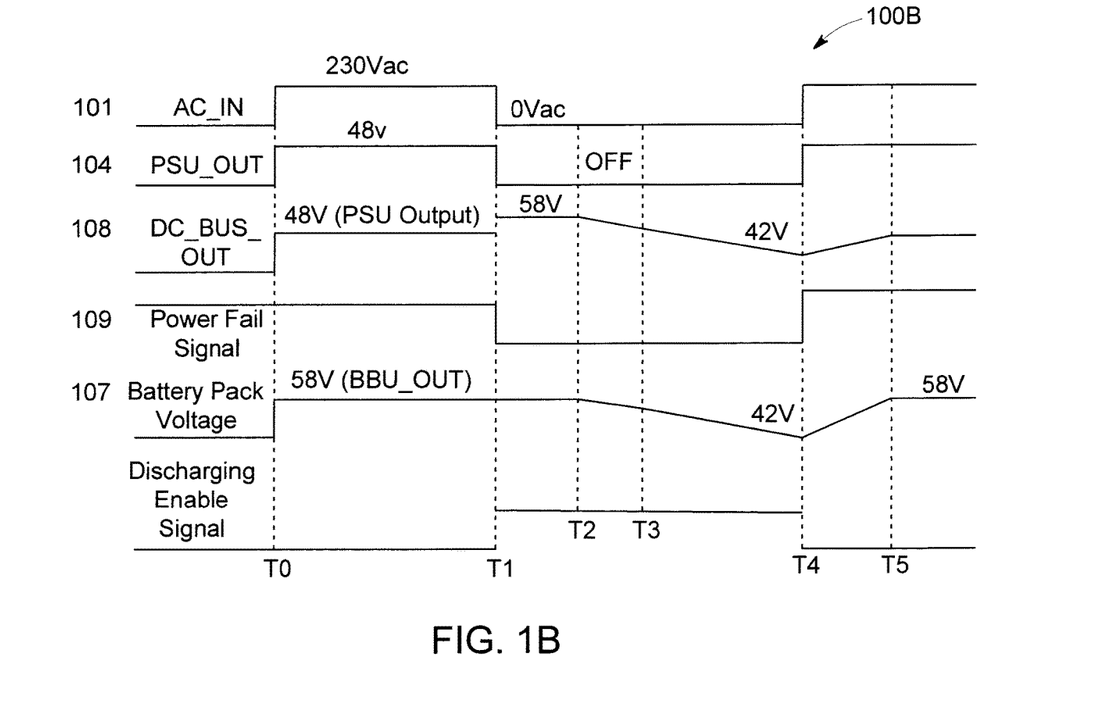
FIG. 1B is a schematic block diagram illustrating timing charts of supplying power using a battery system in response to detecting an AC power failure, in accordance with an implementation of the present disclosure.

FIG. 1B is a schematic block diagram illustrating timing charts 100B of supplying power using a battery system (e.g., the BBU 103 as illustrated in FIG. 1A) of a server system in response to receiving a power failure signal. As illustrated in the timing charts 100B, the server system operates under a normal condition between time T0 and time T1. Under the normal condition, the battery system (e.g., the BBU 103) is disabled from discharging power. A PSU of the server system receives an AC power supply (e.g., the AC power supply 101 in FIG. 1A) and provides a DC output voltage (e.g., the PSU_OUT 104 in FIG. 1A) to a DC/DC converter of the server system. On the other hand, the battery system (e.g., the BBU 103) is fully charged and maintains a battery pack voltage (e.g., the battery pack voltage 107 in FIG. 1A) that is higher than the DC output voltage.

At time T1, a power failure signal is received by a controller (e.g., BMC) of the server system. The power failure signal can be generated by the PSU of the server system. The power failure signal may indicate that at least one of the AC power supply or the PSU of the server system has failed. In response to receiving the power failure signal, the controller sends a discharging-enable command to the battery system. The discharging-enable command causes the battery system to start discharging at time T1.

In some examples, the controller receives from the PSU status information of the AC power supply and the PSU. The controller can send a discharging-enable command to the battery system in response to determining that at least one of the AC power supply or the PSU of the server system has failed.

From T1 to T4, the battery system provides power to the server system and outputs a DC output voltage (e.g., the BBU_OUT 107 in FIG. 1A) to the DC/DC converter of the server system. On the other hand, the PSU of the server system does not provide any power to the DC/DC converter during the same time period. Since the PSU is offline, output voltage (e.g., the DC_BUS_OUT 108 in FIG. 1A) of the DC/DC converter is determined by the DC output voltage (e.g., the BBU_OUT 107 in FIG. 1A) of the battery system.

At time T2, an output voltage of the battery system starts to decrease, which causes the output voltage (e.g., the DC_BUS_OUT 108 in FIG. 1A) of the DC/DC converter decreases proportionally.

At time T4, the AC power supply and the PSU are back online. In response to determining that the AC power supply and the PSU are ok, the controller (e.g., BMC) generates a charging-enable command to enable the battery system to be charged by the PSU.

The controller further determines whether an output voltage of the battery system is equal or lower than a threshold high value (e.g., 58V). At time T5, the output voltage (e.g., the BBU_OUT 107 in FIG. 1A) of the battery system is equal to the threshold high value, the controller generates a charging-disable command to disable the battery system from being further charged by the PSU.

Overall, the present disclosure is advantageous over conventional solutions. In conventional battery backup systems, a discharging DC-DC converter is used to step down output voltage of battery pack to a narrow range of voltages (e.g., 12.5V or 48.5V with +/−5%). However, even highest efficient DC-DC converters can only achieve up to 95% efficiency. The present disclosure provides a high efficient battery system without requiring a discharging DC-DC converter to step down the output voltage of a battery pack. In addition, a controller (e.g., BMC) of the server system is used to managing charging and discharging of the high efficient battery system such that an output voltage of the battery system is maintained within a predetermined voltage range.

Figure 1C:
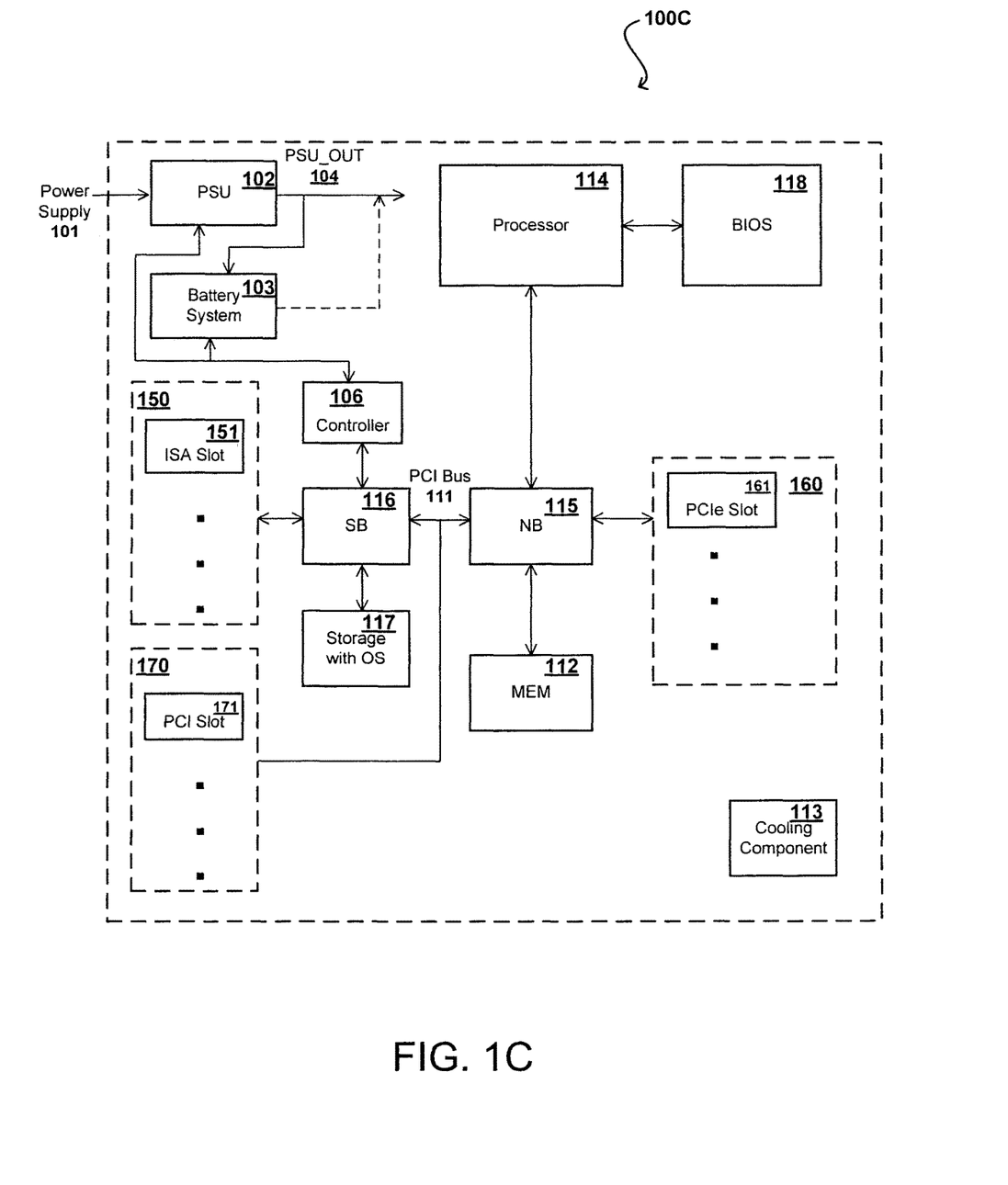
FIG. 1C is a schematic block diagram illustrating an exemplary system with a high efficient battery backup system, in accordance with an implementation of the present disclosure.

FIG. 1C is a schematic block diagram illustrating an exemplary server system 100C with a high efficient battery backup system, in accordance with an implementation of the present disclosure. In this example, the server system 100C includes at least one microprocessor or processor 114, one or more cooling components 113, a main memory (MEM) 112, a battery system 103, and at least one power supply unit (PSU) 102 that receives an AC power from an AC power supply 101 and supply power to various components of the server system 100C, such as the processor 114, the battery system 103, north bridge (NB) logic 115, PCIe slots 160, south bridge (SB) logic 116, storage device 117, BIOS 118 ISA slots 150, PCI slots 170, and a controller 106. After being powered on, the server system 100C is configured to load a software application from memory, computer storage device, or an external storage device to perform various operations. The storage device 117 is structured into logical blocks that are available to an operating system and applications of the server system 100C and configured to retain server data even when the server system 100C is powered off.

The battery system 103 is configured to supply power to the server system 100C in an event that either the power supply 101 or the at least one PSU 102 has failed. In some examples, the battery system 103 comprises a microcontroller unit (MCU), a battery charger, a battery pack, and an Oring MOSFET. The battery pack can include one or more rechargeable battery cells. The one or more rechargeable battery cells may include, but are not limited to, an electrochemical cell, fuel cell, or ultra-capacitor. The electrochemical cell may include one or more chemicals from a list of lead-acid, nickel cadmium (NiCd), nickel metal hydride (NiMH), lithium ion (Li-ion), and lithium ion polymer (Li-ion polymer). In a charging mode, the one or more rechargeable battery cells can be charged by the at least one PSU 102. In a discharging mode, the one or more rechargeable battery cells can supply power to other components of the server system 100C.

The memory 112 can be coupled to the processor 114 via the NB logic 115. The memory 112 may include, but is not limited to, dynamic random access memory (DRAM), double data rate DRAM (DDR DRAM), static RAM (SRAM), or other types of suitable memory. The memory 112 can be configured to store BIOS data of the server system 100C. In some configurations, BIOS data can be stored on the storage device 117.

The BIOS 118 can be any program instructions or firmware configured to initiate and identify various components of the server systems 100C. The BIOS 118 is an important system component that is responsible for initializing and testing hardware components of the server system 100C. The BIOS can provide an abstraction layer for the hardware components thereby providing a consistent way for applications and operating systems to interact with a peripheral device such as a keyboard, a display, and other input/output devices.

In some configurations, the BIOS 118 can run a system check prior to booting up an operating system (OS), e.g., the Microsoft Windows® OS, the Linux® OS, or any operating system, on a corresponding server system. The system check is a diagnostic system examination executed during initialization of the corresponding server system. An example of system check includes a Power-On Self-Test (POST). The BIOS can handle major functions of POST and may offload some duties to other programs designed to initialize specific peripheral devices (e.g., video and small computer system interface (SCSI) initialization). The major functions of POST may include: verifying CPU registers and the integrity of the BIOS code, checking basic components, examining system main memory, and passing control to other specialized BIOS extension. In some configurations, the BIOS may also handle additional POST's functions including: discovering, initializing, and cataloging all system buses and devices, providing a user interface for updating system's configuration, and constructing a system environment required by the operating system.

In system 100C, the storage device 117 can be any storage medium configured to store program instructions or data for a period of time. The storage device can be a shared memory between the controller 106 and processor 114. In some configurations, the storage device can be an independent storage device. The storage device can be a flash drive, a random access memory (RAM), a non-volatile random-access memory (NVRAM), a read-only memory, or an electrically erasable programmable read-only memory (EEPROM). The storage device is configured to store the system configurations such as BIOS data.

The processor 114 can be a central processing unit (CPU) configured to execute program instructions for specific functions. For example, during a booting process, the processor can access BIOS data stored in the storage device 117 and execute the BIOS 118 to initialize the server system 100C. After the booting process, the processor 114 can execute an operating system in order to perform and manage specific tasks for the server system 100C.

In some configurations, the processor 114 can be multi-core processors, each of which is coupled together through a CPU bus connected to the NB logic 115. In some configurations, the NB logic 115 can be integrated into the processor 114. The NB logic 115 can also be connected to a plurality of peripheral component interconnect express (PCIe) slots 160 and an SB logic 116 (optional). The plurality of PCIe slots 160 can be used for connections and buses such as PCI Express x1, USB 2.0, SMBus, SIM card, future extension for another PCIe lane, 1.5 V and 3.3 V power, and wires to diagnostics LEDs on the server system 100C's chassis.

In system 100C, the NB logic 115 and the SB logic 116 are connected by a peripheral component interconnect (PCI) Bus 111. The PCI Bus 111 can support function on the processor 114 but in a standardized format that is independent of any of the processor 114's native buses. The PCI Bus 111 can be further connected to a plurality of PCI slots 170 (e.g., a PCI slot 171). Devices connect to the PCI Bus 111 may appear to a bus controller (not shown) to be connected directly to a CPU bus, assigned addresses in the processor 114's address space, and synchronized to a single bus clock. PCI cards that can be used in the plurality of PCI slots 170 include, but are not limited to, network interface cards (NICs), sound cards, modems, TV tuner cards, disk controllers, video cards, small computer system interface (SCSI) adapters, and personal computer memory card international association (PCMCIA) cards.

The SB logic 116 can couple the PCI Bus 111 to a plurality of expansion cards or ISA slots 150 (e.g., an ISA slot 151) via an expansion bus. The expansion bus can be a bus used for communications between the SB logic 116 and peripheral devices, and may include, but is not limited to, an industry standard architecture (ISA) bus, PC/104 bus, low pin count bus, extended ISA (EISA) bus, universal serial bus (USB), integrated drive electronics (IDE) bus, or any other suitable bus that can be used for data communications for peripheral devices.

In system 100C, the SB logic 116 is further coupled to the controller 106 that is connected to the at least one PSU 102. In some implementations, the controller 106 can be a baseboard management controller (BMC), rack management controller (RMC), or other types of service controllers that are independent from a main central processing unit (e.g., the processor 114) can be used to perform functions disclosed herein.

In some configurations, the controller 106 is coupled to at least one PSU 102 and can receive status information of the power supply 101 and PSU 102 from the at least one PSU 102. For example, the controller 106 can receive voltage, current and temperature data from the at least one PSU 102. Based upon received data, the controller 106 can manage operations of the at least one PSU 102. For example, the controller 106 can power on or off the at least one PSU 102, or power on some of the at least one PSU 102 while power off the remaining PSU. In some examples, the controller 106 can communicate with the at least one PSU 102 via a SMBus, I2C, CANBus, or PMBus.

The controller 106 is also coupled to the battery system 103 and can receive status information (e.g., output voltage and current of a battery pack of the battery system, and temperature of the battery pack) of the battery system 103. For example, the controller 106 can be coupled an MCU of the battery system via a communication interface.

In an event that either the PSU or the AC power supply has failed, the controller 106 can generate a discharging-enable command to enable the battery system 103 to discharge power to the server system 100C. The controller 106 can further determine whether an output voltage of the battery system 103 is above a predetermined low value. In an event the output voltage of the battery system 103 is equal or below the predetermined low value, the controller 106 can generate a discharging-disable command to disable the battery system 103 from further discharging power to the server system 100C.

In response to determining that both the at least one PSU 102 and the AC power supply 101 are ok, the controller 106 can generate a charging-enable command to enable the battery system 103 to be charged by the at least one PSU 102. The controller 106 can further determine whether an output voltage of the battery system 103 is below a threshold high value. In an event the output voltage of the battery system 103 is equal or higher than the threshold high value, the controller 106 can generate a charging-disable command to disable the battery system 103 from being further charged by the at least one PSU 102.

In some implementations, the controller 106 can monitor operating characteristics of each battery cell and operation modes of a battery pack in the battery system 103. For example, the controller 106 can monitor an output voltage of each battery cell of the battery system 103, temperature and DC resistance of each battery cell, output voltage and DC resistance of each battery cell, charging and recharging history, and/or environment temperature. Based upon operating characteristic of each battery cell in the battery system 103, the controller 106 may determine a suitable power down sequence in an event of an AC power outrage. For example, certain non-critical components may be powered off first to save power for transferring out processes of the server system 100C or safely stores processing data on the server system 100C.

In some configurations, the controller 106 can communicate with the processor 114 and the storage device 117 via Intelligent Platform Management Interface (IPMI) messages using Intelligent Platform Management Bus/Bridge (IPMB). IPMB is an enhanced implementation of I²C bus and is a message-based, hardware-level basic interface specification.

In some implementations, the controller 106 may be configured to monitor power supply patterns, temperature of server rack and/or datacenter, power outrage warning(s) associated with the datacenter, processing demands, and components and/or connection status of the server system 100C. Based at least upon potential/anticipated AC power outrage, the controller 106 may be configured to transfer processes on the server system 100C to other server systems that are not affected by the potential/anticipated AC power outrage, and also prepare the battery system 103 to be ready to supply power to the server system 100C.

Although only certain components are shown within the exemplary systems 100A and 100C in FIGS. 1A and 1C, respectively, various types of electronic or computing components that are capable of processing or storing data, or receiving or transmitting signals, can also be included in the exemplary systems 100A and 100C. Further, the electronic or computing components in the exemplary systems 100A and 100C can be configured to execute various types of application and/or can use various types of operating systems. These operating systems can include, but are not limited to, Android, Berkeley Software Distribution (BSD), iPhone OS (iOS), Linux, OS X, Unix-like Real-time Operating System (e.g., QNX), Microsoft Windows, Window Phone, and IBM z/OS.

Depending on the desired implementation for the exemplary systems 100A and 100C, a variety of networking and messaging protocols can be used, including but not limited to TCP/IP, open systems interconnection (OSI), file transfer protocol (FTP), universal plug and play (UpnP), network file system (NFS), common internet file system (CIFS), Apple-Talk etc. As would be appreciated by those skilled in the art, the exemplary systems 100A and 100C illustrated in FIGS. 1A and 1C are used for purposes of explanation. Therefore, a network system can be implemented with many variations, as appropriate, yet still provide a configuration of network platform in accordance with various examples of the present disclosure.

In exemplary configurations of FIGS. 1A and 1C, the exemplary systems 100A and 100C can also include one or more wireless components operable to communicate with one or more electronic devices within a computing range of the particular wireless channel. The wireless channel can be any appropriate channel used to enable devices to communicate wirelessly, such as Bluetooth, cellular, NFC, or Wi-Fi channels. It should be understood that the device can have one or more conventional wired communications connections, as known in the art. Various other elements and/or combinations are possible as well within the scope of various examples.

Figure 2:
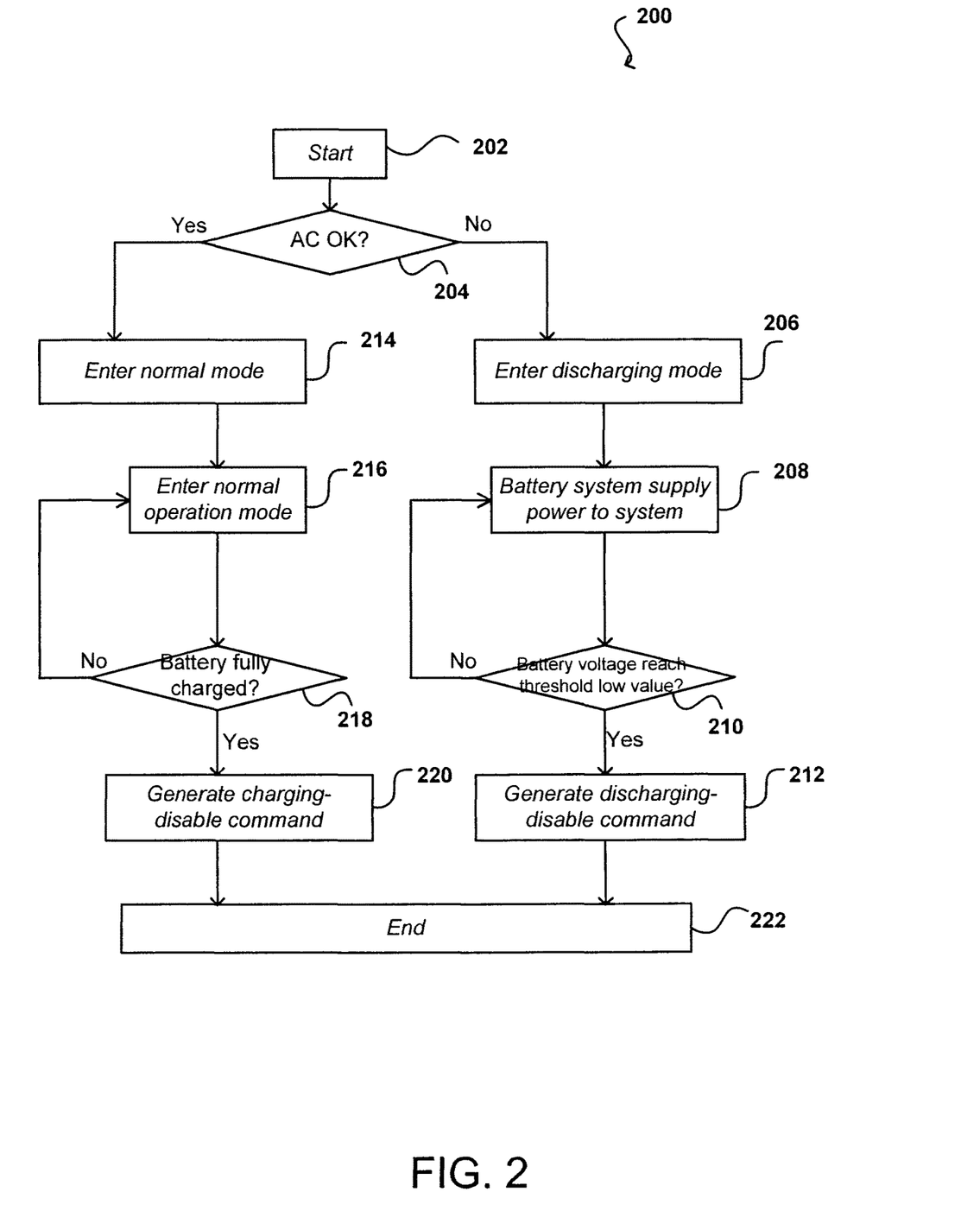
FIG. 2 illustrates an exemplary method of charging and discharging a high efficient battery system in accordance with an implementation of the present technology.

FIG. 2 illustrates an exemplary method 200 of charging and discharging a high efficient battery system of a server system in accordance with an implementation of the present technology. It should be understood that the exemplary method 200 is presented solely for illustrative purposes and that in other methods in accordance with the present disclosure can include additional, fewer, or alternative steps performed in similar or alternative orders, or in parallel. The exemplary method 200 starts with step 202. At step 204, a controller (e.g., BMC) of the server system can determine whether a PSU and an AC power supply of the server system are okay, as illustrated in FIGS. 1A-1C. In some examples, the controller can receive status information of the PSU and the AC power supply and determine whether the PSU and the AC power supply are ok based upon received status information. In some examples, the PSU can generate a power failure signal in response to determining that either the PSU or the AC power supply functions abnormal.

At step 206, in an event that either the PSU or the AC power supply has failed, the controller can generate a discharging-enable command to enable a high efficient battery system to discharge power to the server system, as illustrated in FIGS. 1A-1C. In some examples, the high efficient battery system comprises a microcontroller unit (MCU), a battery charger, a battery pack, and an Oring MOSFET connected to a DC/DC converter of the server system. The high efficient battery system does not include a discharging DC/DC converter.

At step 208, the battery system supplies power to the server system in response to receiving discharging-enable command, as illustrated in FIGS. 1A-1C. In some examples, in an event that the PSU behaves abnormally (e.g., a short-term sag), the controller can also generate a discharging-enable command to enable the battery system to immediately discharge power to the server system. The battery system can supply power to the sever system to ensure that the server system operates with a stable power source.

At step 210, the controller can determine whether a battery voltage of the battery system has reached a threshold low value, as illustrated in FIGS. 1A-1C. In an event that the battery voltage of the battery system is above the threshold low value, the battery system continues to discharge power to the server system and the method 200 goes back to step 210.

In an event the output voltage of the battery system is equal or below the predetermined low value, the controller generates a discharging-disable command to disable the battery system from further discharging power to the server system, at step 212, as illustrated in FIGS. 1A-1C.

At step 214, in an event that both the PSU and the AC power supply are okay, the server system enters a normal operation mode, as illustrated in FIGS. 1A-1C. At step 216, the controller can generate a charging-enable command to enable the battery system to be charged by the PSU, as illustrated in FIGS. 1A-1C.

At step 218, the controller can determine whether an output voltage of the battery system is below a threshold high value, as illustrated in FIGS. 1A-1C. In an event that the battery voltage of the battery system is below the threshold high value, the battery system continues to be charged by the PSU and the method 200 goes back to step 216.

At step 220, in an event that the output voltage of the battery system is equal or higher than the threshold high value, the controller generates a charging-disable command to disable the battery system from being further charged by the PSU, as illustrated in FIGS. 1A-1C.

The above discussion is meant to be illustrative of the principles and various examples of the present disclosure. Numerous variations and modifications will become apparent once the above disclosure is fully appreciated.

Terminologies

A computer network is a geographically distributed collection of nodes interconnected by communication links and segments for transporting data between endpoints, such as personal computers and workstations. Many types of networks are available, with the types ranging from local area networks (LANs) and wide area networks (WANs) to overlay and software-defined networks, such as virtual extensible local area networks (VXLANs).

LANs typically connect nodes over dedicated private communications links located in the same general physical location, such as a building or campus. WANs, on the other hand, typically connect geographically dispersed nodes over long-distance communications links, such as common carrier telephone lines, optical lightpaths, synchronous optical networks (SONET), or synchronous digital hierarchy (SDH) links. LANs and WANs can include layer 2 (L2) and/or layer 3 (L3) networks and devices.

The Internet is an example of a WAN that connects disparate networks throughout the world, providing global communication between nodes on various networks. The nodes typically communicate over the network by exchanging discrete frames or packets of data according to predefined protocols, such as the Transmission Control Protocol/Internet Protocol (TCP/IP). In this context, a protocol can refer to a set of rules defining how the nodes interact with each other. Computer networks can be further interconnected by an intermediate network node, such as a router, to extend the effective "size" of each network.

Overlay networks generally allow virtual networks to be created and layered over a physical network infrastructure. Overlay network protocols, such as Virtual Extensible LAN (VXLAN), Network Virtualization using Generic Routing Encapsulation (NVGRE), Network Virtualization Overlays (NVO3), and Stateless Transport Tunneling (STT), provide a traffic encapsulation scheme which allows network traffic to be carried across L2 and L3 networks over a logical tunnel. Such logical tunnels can be originated and terminated through virtual tunnel end points (VTEPs).

Moreover, overlay networks can include virtual segments, such as VXLAN segments in a VXLAN overlay network, which can include virtual L2 and/or L3 overlay networks over which VMs communicate. The virtual segments can be identified through a virtual network identifier (VNI), such as a VXLAN network identifier, which can specifically identify an associated virtual segment or domain.

Network virtualization allows hardware and software resources to be combined in a virtual network. For example, network virtualization can allow multiple numbers of VMs to be attached to the physical network via respective virtual LANs (VLANs). The VMs can be grouped according to their respective VLAN, and can communicate with other VMs as well as other devices on the internal or external network.

Network segments, such as physical or virtual segments, networks, devices, ports, physical or logical links, and/or traffic in general can be grouped into a bridge or flood domain. A bridge domain or flood domain can represent a broadcast domain, such as an L2 broadcast domain. A bridge domain or flood domain can include a single subnet, but can also include multiple subnets. Moreover, a bridge domain can be associated with a bridge domain interface on a network device, such as a switch. A bridge domain interface can be a logical interface which supports traffic between an L2 bridged network and an L3 routed network. In addition, a bridge domain interface can support internet protocol (IP) termination, VPN termination, address resolution handling, MAC addressing, etc. Both bridge domains and bridge domain interfaces can be identified by a same index or identifier.

Furthermore, endpoint groups (EPGs) can be used in a network for mapping applications to the network. In particular, EPGs can use a grouping of application endpoints in a network to apply connectivity and policy to the group of applications. EPGs can act as a container for buckets or collections of applications, or application components, and tiers for implementing forwarding and policy logic. EPGs also allow separation of network policy, security, and forwarding from addressing by instead using logical application boundaries.

Cloud computing can also be provided in one or more networks to provide computing services using shared resources. Cloud computing can generally include Internet-based computing in which computing resources are dynamically provisioned and allocated to client or user computers or other devices on-demand, from a collection of resources available via the network (e.g., "the cloud"). Cloud computing resources, for example, can include any type of resource, such as computing, storage, and network devices, virtual machines (VMs), etc. For instance, resources can include service devices (firewalls, deep packet inspectors, traffic monitors, load balancers, etc.), compute/processing devices (servers, CPU's, memory, brute force processing capability), storage devices (e.g., network attached storages, storage area network devices), etc. In addition, such resources can be used to support virtual networks, virtual machines (VM), databases, applications (Apps), etc.

Cloud computing resources can include a "private cloud," a "public cloud," and/or a "hybrid cloud." A "hybrid cloud" can be a cloud infrastructure composed of two or more clouds that inter-operate or federate through technology. In essence, a hybrid cloud is an interaction between private and public clouds where a private cloud joins a public cloud and utilizes public cloud resources in a secure and scalable manner. Cloud computing resources can also be provisioned via virtual networks in an overlay network, such as a VXLAN.

Figure 3:
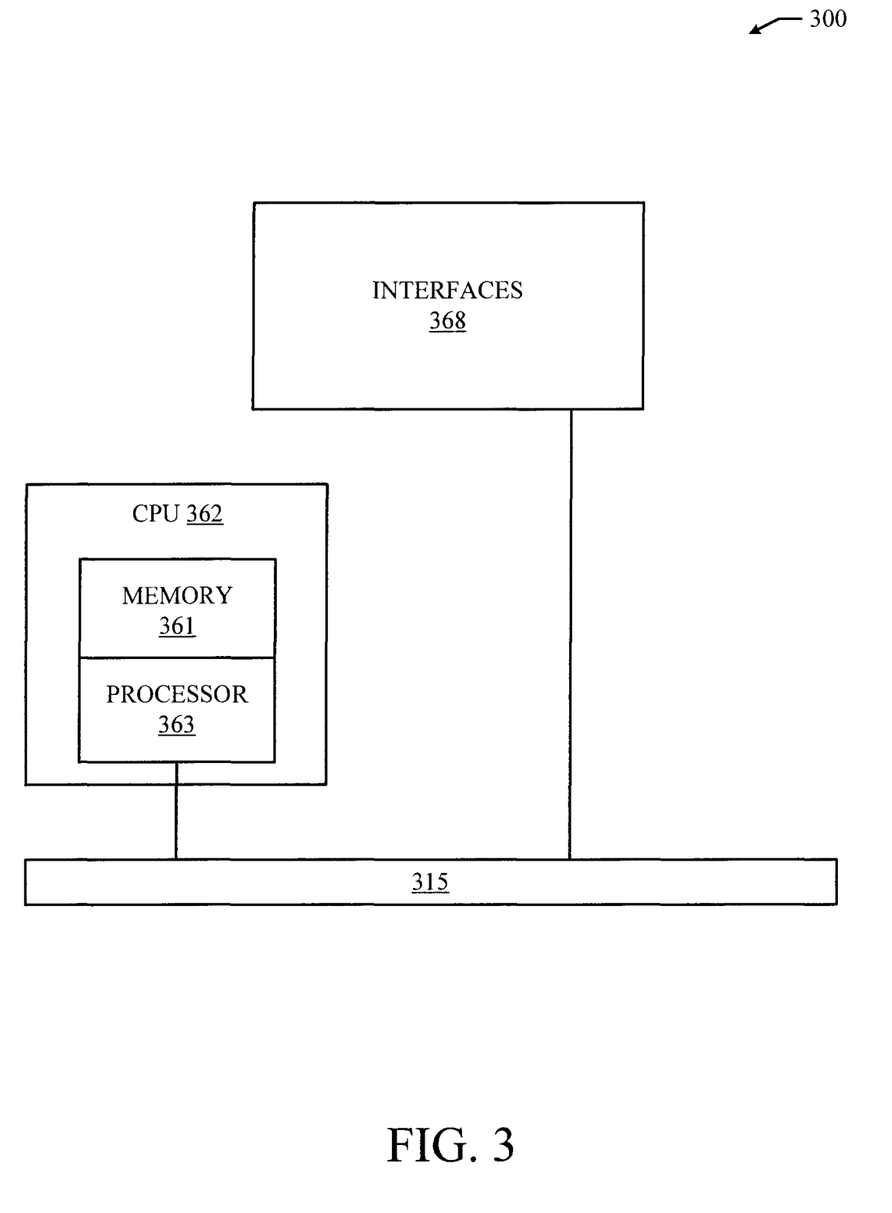
FIG. 3 illustrates an exemplary computing device in accordance with various implementations of the technology.
Figure 4:
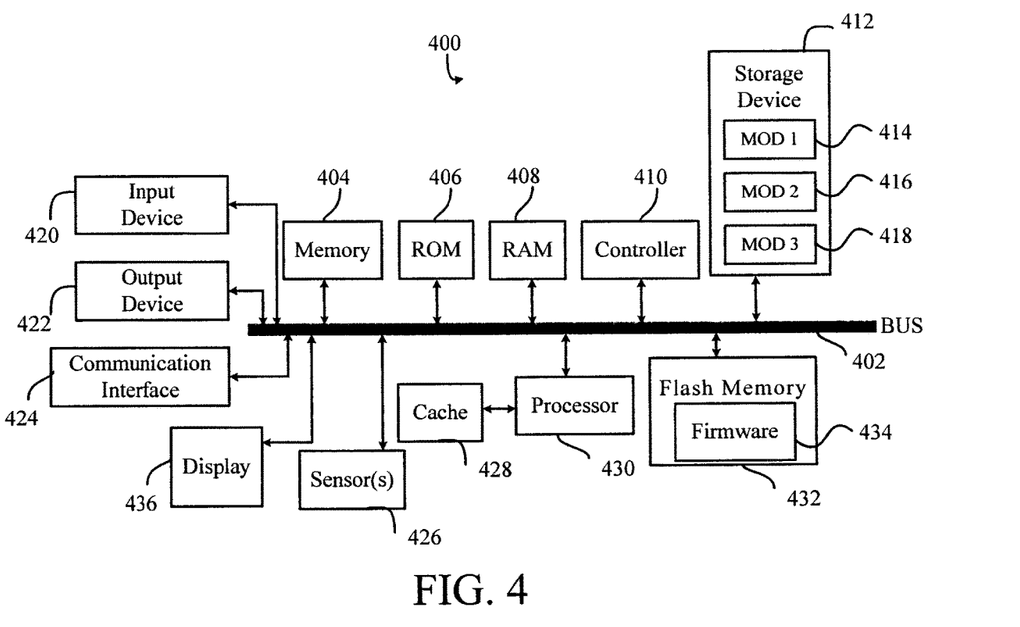
FIGS. 4 and 5 illustrate exemplary systems in accordance with various examples of the present technology.

In a network switch system, a lookup database can be maintained to keep track of routes between a number of end points attached to the switch system. However, end points can have various configurations and are associated with numerous tenants. These end-points can have various types of identifiers, e.g., IPv4, IPv6, or Layer-2. The lookup database has to be configured in different modes to handle different types of end-point identifiers. Some capacity of the lookup database is carved out to deal with different address types of incoming packets. Further, the lookup database on the network switch system is typically limited by 1K virtual routing and forwarding (VRFs). Therefore, an improved lookup algorithm is desired to handle various types of end-point identifiers. The disclosed technology addresses the need in the art for address lookups in a telecommunications network. Disclosed are systems, methods, and computer-readable storage media for unifying various types of end-point identifiers by mapping end-point identifiers to a uniform space and allowing different forms of lookups to be uniformly handled. A brief introductory description of example systems and networks, as illustrated in FIGS. 3 and 4, is disclosed herein. These variations shall be described herein as the various examples are set forth. The technology now turns to FIG. 3.

FIG. 3 illustrates an example computing device 300 suitable for implementing the present disclosure. Computing device 300 includes a master central processing unit (CPU) 362, interfaces 368, and a bus 315 (e.g., a PCI bus). When acting under the control of appropriate software or firmware, the CPU 362 is responsible for executing packet management, error detection, and/or routing functions, such as miscabling detection functions, for example. The CPU 362 preferably accomplishes all these functions under the control of software including an operating system and any appropriate applications software. CPU 362 can include one or more processors 363 such as a processor from the Motorola family of microprocessors or the MIPS family of microprocessors. In an alternative example, processor 363 is specially designed hardware for controlling the operations of the computing device 300. In a specific example, a memory 361 (such as non-volatile RAM and/or ROM) also forms part of CPU 362. However, there are many different ways in which memory could be coupled to the system.

The interfaces 368 are typically provided as interface cards (sometimes referred to as "line cards"). Generally, they control the sending and receiving of data packets over the network and sometimes support other peripherals used with the computing device 300. Among the interfaces that can be provided are Ethernet interfaces, frame relay interfaces, cable interfaces, DSL interfaces, token ring interfaces, and the like. In addition, various very high-speed interfaces can be provided such as fast token ring interfaces, wireless interfaces, Ethernet interfaces, Gigabit Ethernet interfaces, ATM interfaces, HSSI interfaces, POS interfaces, FDDI interfaces and the like. Generally, these interfaces can include ports appropriate for communication with the appropriate media. In some cases, they can also include an independent processor and, in some instances, volatile RAM. The independent processors can control such communications intensive tasks as packet switching, media control and management. By providing separate processors for the communications intensive tasks, these interfaces allow the master microprocessor 362 to efficiently perform routing computations, network diagnostics, security functions, etc.

Although the system shown in FIG. 3 is one specific computing device of the present disclosure, it is by no means the only network device architecture on which the present patent application can be implemented. For example, an architecture having a single processor that handles communications as well as routing computations, etc. is often used. Further, other types of interfaces and media could also be used with the router.

Regardless of the network device's configuration, it can employ one or more memories or memory modules (including memory 361) configured to store program instructions for the general-purpose network operations and mechanisms for roaming, route optimization and routing functions described herein. The program instructions can control the operation of an operating system and/or one or more applications, for example. The memory or memories can also be configured to store tables such as mobility binding, registration, and association tables, etc.

Figure 5:
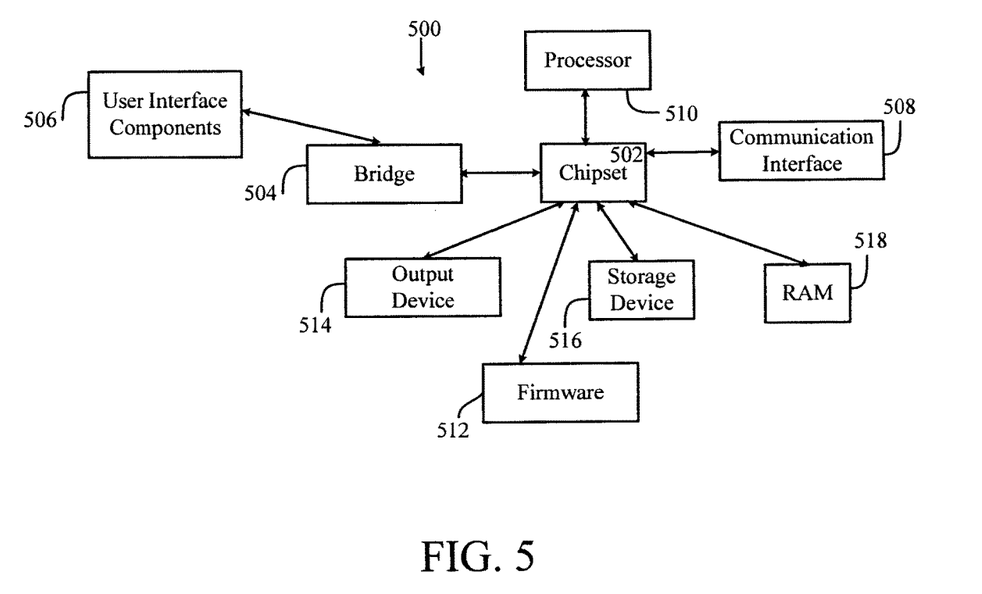

FIGS. 4 and 5 illustrate example system examples. The more appropriate embodiment will be apparent to those of ordinary skill in the art when practicing the present disclosure. Persons of ordinary skill in the art will also readily appreciate that other system examples are possible.

FIG. 4 illustrates a system bus computing system architecture 400 wherein the components of the system are in electrical communication with each other using a bus 402. Example system 400 includes a processing unit (CPU or processor) 430 and a system bus 402 that couples various system components including the system memory 404, such as read only memory (ROM) 406 and random access memory (RAM) 408, to the processor 430. The system 400 can include a cache of high-speed memory connected directly with, in close proximity to, or integrated as part of the processor 430. The system 400 can copy data from the memory 404 and/or the storage device 412 to the cache 428 for quick access by the processor 430. In this way, the cache can provide a performance boost that avoids processor 430 delays while waiting for data. These and other modules can control or be configured to control the processor 430 to perform various actions. Other system memory 404 may be available for use as well. The memory 404 can include multiple different types of memory with different performance characteristics. The processor 430 can include any general purpose processor and a hardware module or software module, such as module 1 414, module 2 416, and module 3 418 stored in storage device 412, configured to control the processor 430 as well as a special-purpose processor where software instructions are incorporated into the actual processor design. The processor 430 may essentially be a completely self-contained computing system, containing multiple cores or processors, a bus, memory controller, cache, etc. A multi-core processor may be symmetric or asymmetric.

To enable user interaction with the computing device 400, an input device 420 can represent any number of input mechanisms, such as a microphone for speech, a touch-sensitive screen for gesture or graphical input, keyboard, mouse, motion input, and so forth. An output device 422 can also be one or more of a number of output mechanisms known to those of skill in the art. In some instances, multimodal systems can enable a user to provide multiple types of input to communicate with the system 400. The communications interface 424 can generally govern and manage the user input and system output. There is no restriction on operating on any particular hardware arrangement and therefore the basic features here may easily be substituted for improved hardware or firmware arrangements as they are developed.

Storage device 412 is a non-volatile memory and can be a hard disk or other types of computer readable media which can store data that are accessible by a computer, such as magnetic cassettes, flash memory cards, solid state memory devices, digital versatile disks, cartridges, random access memories (RAMs) 408, read only memory (ROM) 406, and hybrids thereof.

The storage device 412 can include software modules 414, 416, 418 for controlling the processor 430. Other hardware or software modules are contemplated. The storage device 412 can be connected to the system bus 402. In one aspect, a hardware module that performs a particular function can include the software component stored in a computer-readable medium in connection with the necessary hardware components, such as the processor 430, bus 402, display 436, and so forth, to carry out the function.

The controller 410 can be a specialized microcontroller or processor on the system 400, such as a BMC (baseboard management controller). In some cases, the controller 410 can be part of an Intelligent Platform Management Interface (IPMI). Moreover, in some cases, the controller 410 can be embedded on a motherboard or main circuit board of the system 400. The controller 410 can manage the interface between system management software and platform hardware. The controller 410 can also communicate with various system devices and components (internal and/or external), such as controllers or peripheral components, as further described below.

The controller 410 can generate specific responses to notifications, alerts, and/or events and communicate with remote devices or components (e.g., electronic mail message, network message, etc.), generate an instruction or command for automatic hardware recovery procedures, etc. An administrator can also remotely communicate with the controller 410 to initiate or conduct specific hardware recovery procedures or operations, as further described below.

Different types of sensors (e.g., sensors 426) on the system 400 can report to the controller 410 on parameters such as cooling fan speeds, power status, operating system (OS) status, hardware status, and so forth. The controller 410 can also include a system event log controller and/or storage for managing and maintaining events, alerts, and notifications received by the controller 410. For example, the controller 410 or a system event log controller can receive alerts or notifications from one or more devices and components and maintain the alerts or notifications in a system event log storage component.

Flash memory 432 can be an electronic non-volatile computer storage medium or chip which can be used by the system 400 for storage and/or data transfer. The flash memory 432 can be electrically erased and/or reprogrammed. Flash memory 432 can include erasable programmable read-only memory (EPROM), electrically erasable programmable read-only memory (EEPROM), ROM, NVRAM, or complementary metal-oxide semiconductor (CMOS), for example. The flash memory 432 can store the firmware 434 executed by the system 400 when the system 400 is first powered on, along with a set of configurations specified for the firmware 434. The flash memory 432 can also store configurations used by the firmware 434.

The firmware 434 can include a Basic Input/Output System or its successors or equivalents, such as an Extensible Firmware Interface (EFI) or Unified Extensible Firmware Interface (UEFI). The firmware 434 can be loaded and executed as a sequence program each time the system 400 is started. The firmware 434 can recognize, initialize, and test hardware present in the system 400 based on the set of configurations. The firmware 434 can perform a self-test, such as a Power-on-Self-Test (POST), on the system 400. This self-test can test functionality of various hardware components such as hard disk drives, optical reading devices, cooling devices, memory modules, expansion cards and the like. The firmware 434 can address and allocate an area in the memory 404, ROM 406, RAM 408, and/or storage device 412, to store an operating system (OS). The firmware 434 can load a boot loader and/or OS, and give control of the system 400 to the OS.

The firmware 434 of the system 400 can include a firmware configuration that defines how the firmware 434 controls various hardware components in the system 400. The firmware configuration can determine the order in which the various hardware components in the system 400 are started. The firmware 434 can provide an interface, such as an UEFI, that allows a variety of different parameters to be set, which can be different from parameters in a firmware default configuration. For example, a user (e.g., an administrator) can use the firmware 434 to specify clock and bus speeds, define what peripherals are attached to the system 400, set monitoring of health (e.g., fan speeds and CPU temperature limits), and/or provide a variety of other parameters that affect overall performance and power usage of the system 400.

While firmware 434 is illustrated as being stored in the flash memory 432, one of ordinary skill in the art will readily recognize that the firmware 434 can be stored in other memory components, such as memory 404 or ROM 406, for example. However, firmware 434 is illustrated as being stored in the flash memory 432 as a non-limiting example for explanation purposes.

System 400 can include one or more sensors 426. The one or more sensors 426 can include, for example, one or more temperature sensors, thermal sensors, oxygen sensors, chemical sensors, noise sensors, heat sensors, current sensors, voltage detectors, air flow sensors, flow sensors, infrared thermometers, heat flux sensors, thermometers, pyrometers, etc. The one or more sensors 426 can communicate with the processor, cache 428, flash memory 432, communications interface 424, memory 404, ROM 406, RAM 408, controller 410, and storage device 412, via the bus 402, for example. The one or more sensors 426 can also communicate with other components in the system via one or more different means, such as inter-integrated circuit (I2C), general purpose output (GPO), and the like.

FIG. 5 illustrates an example computer system 500 having a chipset architecture that can be used in executing the described method(s) or operations, and generating and displaying a graphical user interface (GUI). Computer system 500 can include computer hardware, software, and firmware that can be used to implement the disclosed technology. System 500 can include a processor 510, representative of any number of physically and/or logically distinct resources capable of executing software, firmware, and hardware configured to perform identified computations. Processor 510 can communicate with a chipset 502 that can control input to and output from processor 510. In this example, chipset 502 outputs information to output device 514, such as a display, and can read and write information to storage device 516, which can include magnetic media, and solid state media, for example. Chipset 502 can also read data from and write data to RAM 518. A bridge 504 for interfacing with a variety of user interface components 506 can be provided for interfacing with chipset 502. Such user interface components 506 can include a keyboard, a microphone, touch detection and processing circuitry, a pointing device, such as a mouse, and so on. In general, inputs to system 500 can come from any of a variety of sources, machine generated and/or human generated.

Chipset 502 can also interface with one or more communication interfaces 508 that can have different physical interfaces. Such communication interfaces can include interfaces for wired and wireless local area networks, for broadband wireless networks, as well as personal area networks. Some applications of the methods for generating, displaying, and using the GUI disclosed herein can include receiving ordered datasets over the physical interface or be generated by the machine itself by processor 510 analyzing data stored in storage 516 or 518. Further, the machine can receive inputs from a user via user interface components 506 and execute appropriate functions, such as browsing functions by interpreting these inputs using processor 510.

Moreover, chipset 502 can also communicate with firmware 512, which can be executed by the computer system 500 when powering on. The firmware 512 can recognize, initialize, and test hardware present in the computer system 500 based on a set of firmware configurations. The firmware 512 can perform a self-test, such as a POST, on the system 500. The self-test can test the functionality of the various hardware components 502-518. The firmware 512 can address and allocate an area in the memory 518 to store an OS. The firmware 512 can load a boot loader and/or OS, and give control of the system 500 to the OS. In some cases, the firmware 512 can communicate with the hardware components 502-510 and 514-518. Here, the firmware 512 can communicate with the hardware components 502-510 and 514-518 through the chipset 502 and/or through one or more other components. In some cases, the firmware 512 can communicate directly with the hardware components 502-510 and 514-518.

It can be appreciated that example systems 300, 400 and 500 can have more than one processor (e.g., 363, 430, 510) or be part of a group or cluster of computing devices networked together to provide greater processing capability.

For clarity of explanation, in some instances the present disclosure may be presented as including individual functional blocks including functional blocks including devices, device components, steps or routines in a method embodied in software, or combinations of hardware and software.

In some examples the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer readable media. Such instructions can include, for example, instructions and data which cause or otherwise configure a general purpose computer, special purpose computer, or special purpose processing device to perform a certain function or group of functions. Portions of computer resources used can be accessible over a network. The computer executable instructions may be, for example, binaries, intermediate format instructions such as assembly language, firmware, or source code. Examples of computer-readable media that may be used to store instructions, information used, and/or information created during methods according to described examples include magnetic or optical disks, flash memory, USB devices provided with non-volatile memory, networked storage devices, and so on.

Devices implementing methods according to these disclosures can include hardware, firmware and/or software, and can take any of a variety of form factors. Typical examples of such form factors include laptops, smart phones, small form factor personal computers, personal digital assistants, rackmount devices, standalone devices, and so on. Functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are means for providing the functions described herein.

Various aspects of the present disclosure provide systems and methods for charging and discharging a high efficient battery system of a server system in a datacenter. While specific examples have been cited above showing how the optional operation can be employed in different instructions, other examples can incorporate the optional operation into different instructions. For clarity of explanation, in some instances the present disclosure can be presented as including individual functional blocks including functional blocks including devices, device components, steps or routines in a method embodied in software, or combinations of hardware and software.

The various examples can be further implemented in a wide variety of operating environments, which in some cases can include one or more server computers, user computers or computing devices which can be used to operate any of a number of applications. User or client devices can include any of a number of general purpose personal computers, such as desktop or laptop computers running a standard operating system, as well as cellular, wireless and handheld devices running mobile software and capable of supporting a number of networking and messaging protocols. Such a system can also include a number of workstations running any of a variety of commercially-available operating systems and other known applications for purposes such as development and database management. These devices can also include other electronic devices, such as dummy terminals, thin-clients, gaming systems and other devices capable of communicating via a network.

To the extent examples, or portions thereof, are implemented in hardware, the present patent application can be implemented with any or a combination of the following technologies: a discrete logic circuit(s) having logic gates for implementing logic functions upon data signals, an application specific integrated circuit (ASIC) having appropriate combinational logic gates, programmable hardware such as a programmable gate array(s) (PGA), a field programmable gate array (FPGA), etc.

Most examples utilize at least one network that would be familiar to those skilled in the art for supporting communications using any of a variety of commercially-available protocols, such as TCP/IP, OSI, FTP, UPnP, NFS, CIFS, AppleTalk etc. The network can be, for example, a local area network, a wide-area network, a virtual private network, the Internet, an intranet, an extranet, a public switched telephone network, an infrared network, a wireless network and any combination thereof.

Methods according to the above-described examples can be implemented using computer-executable instructions that are stored or otherwise available from computer readable media. Such instructions can include, for example, instructions and data which cause or otherwise configure a general purpose computer, special purpose computer, or special purpose processing device to perform a certain function or group of functions. Portions of computer resources used can be accessible over a network. The computer executable instructions can be, for example, binaries, intermediate format instructions such as assembly language, firmware, or source code. Examples of computer-readable media that can be used to store instructions, information used, and/or information created during methods according to described examples include magnetic or optical disks, flash memory, USB devices provided with non-volatile memory, networked storage devices, and so on.

Devices implementing methods according to these technologies can include hardware, firmware and/or software, and can take any of a variety of form factors. Typical examples of such form factors include server computers, laptops, smart phones, small form factor personal computers, personal digital assistants, and so on. Functionality described herein also can be embodied in peripherals or add-in cards. Such functionality can also be implemented on a circuit board among different chips or different processes executing in a single device, by way of further example.

In examples utilizing a Web server, the Web server can run any of a variety of server or mid-tier applications, including HTTP servers, FTP servers, CGI servers, data servers, Java servers and business application servers. The server(s) can also be capable of executing programs or scripts in response to requests from user devices, such as by executing one or more Web applications that can be implemented as one or more scripts or programs written in any programming language, such as Java®, C, C# or C++ or any scripting language, such as Perl, Python or TCL, as well as combinations thereof. The server(s) can also include database servers, including without limitation those commercially available from open market.

The server system can include a variety of data stores and other memory and storage media as discussed above. These can reside in a variety of locations, such as on a storage medium local to (and/or resident in) one or more of the computers or remote from any or all of the computers across the network. In a particular set of examples, the information can reside in a storage-area network (SAN) familiar to those skilled in the art. Similarly, any necessary files for performing the functions attributed to the computers, servers or other network devices can be stored locally and/or remotely, as appropriate. Where a system includes computerized devices, each such device can include hardware elements that can be electrically coupled via a bus, the elements including, for example, at least one central processing unit (CPU), at least one input device (e.g., a mouse, keyboard, controller, touch-sensitive display element or keypad) and at least one output device (e.g., a display device, printer or speaker). Such a system can also include one or more storage devices, such as disk drives, optical storage devices and solid-state storage devices such as random access memory (RAM) or read-only memory (ROM), as well as removable media devices, memory cards, flash cards, etc.

Such devices can also include a computer-readable storage media reader, a communications device (e.g., a modem, a network card (wireless or wired), an infrared computing device) and working memory as described above. The computer-readable storage media reader can be connected with, or configured to receive, a computer-readable storage medium representing remote, local, fixed and/or removable storage devices as well as storage media for temporarily and/or more permanently containing, storing, transmitting and retrieving computer-readable information. The system and various devices also typically will include a number of software applications, modules, services or other elements located within at least one working memory device, including an operating system and application programs such as a client application or Web browser. It should be appreciated that alternate examples can have numerous variations from that described above. For example, customized hardware might also be used and/or particular elements might be implemented in hardware, software (including portable software, such as applets) or both. Further, connection to other computing devices such as network input/output devices can be employed.

Storage media and computer readable media for containing code, or portions of code, can include any appropriate media known or used in the art, including storage media and computing media, such as but not limited to volatile and non-volatile, removable and non-removable media implemented in any method or technology for storage and/or transmission of information such as computer readable instructions, data structures, program modules or other data, including RAM, ROM, EPROM, EEPROM, flash memory or other memory technology, CD-ROM, digital versatile disk (DVD) or other optical storage, magnetic cassettes, magnetic tape, magnetic disk storage or other magnetic storage devices or any other medium which can be used to store the desired information and which can be accessed by a system device. Based on the technology and teachings provided herein, a person of ordinary skill in the art will appreciate other ways and/or methods to implement the various aspects of the present disclosure.

The specification and drawings are, accordingly, to be regarded in an illustrative rather than a restrictive sense. It will, however, be evident that various modifications and changes can be made thereunto without departing from the broader spirit and scope of the patent application as set forth in the claims.

What is claimed is:

1. A computer-implemented method for charging and discharging a high efficient battery system of a server system, comprising:
    receiving, at a base board controller (BMC) of the server system, status information of an AC power supply and a power supply unit (PSU) of the server system;
    in an event that either the AC power supply or the PSU fails, generating a discharging-enable command to enable the high efficient battery system to discharge power to the server system;
    receiving status information of the high efficient battery system via a communication interface; and
    in an event that an output voltage of the high efficient battery system is equal or below a threshold low value, generating a discharging-disable command to disable the high efficient battery system from further discharging power to the server system;
    wherein the high efficient battery system comprises a microcontroller unit (MCU), a battery charger, a battery pack, and an Oring MOSFET, and wherein the high efficient battery system does not include a discharging DC/DC converter;
    wherein the battery charger is connected to an output of the PSU; and wherein the MCU is coupled to the BMC via the communication interface.

2. The computer-implemented method of claim 1, wherein the BMC controls discharging of the high efficient battery system by sending the discharging-enable command and the discharging-disable command to the MCU via the communication interface.

3. The computer-implemented method of claim 1, wherein the Oring MOSFET is directly connected to the battery pack and the MCU, and wherein the Oring MOSFET is connected to a DC/DC converter of the server system.

4. The computer-implemented method of claim 1, further comprising:
    in an event that the PSU behaves abnormally, generating the discharging-enable command to enable the high efficient battery system to discharge power to the server system.

5. The computer-implemented method of claim 1, further comprising:
    in an event that both the AC power supply and the PSU are okay, generating a charging-enable command to enable the high efficient battery system to be charged by the PSU.

6. The computer-implemented method of claim 5, further comprising:
    in an event that an output voltage of the high efficient battery system is equal or above a threshold high value, generating a charging-disable command to disable the high efficient battery system from being further charged by the PSU.

7. A system for charging and discharging a high efficient battery system, comprising:
    a processor; and
    a non-transitory computer-readable medium storing instructions that, when executed by the processor, cause the system to perform operations comprising:
    receiving, at a base board controller (BMC) of the system, status information of an AC power supply and a power supply unit (PSU) of the system;
    in an event that either the AC power supply or the PSU fails, generating a discharging-enable command to enable the high efficient battery system to discharge power to the system;
    receiving status information of the high efficient battery system via a communication interface; and
    in an event that an output voltage of the high efficient battery system is equal or below a threshold low value, generating a discharging-disable command to disable the high efficient battery system from further discharging power to the system;
    wherein the high efficient battery system comprises a microcontroller unit (MCU), a battery charger, a battery pack, and an Oring MOSFET, wherein the high efficient battery system does not include a discharging DC/DC converter; and wherein the battery charger is connected to an output of the PSU, and wherein the MCU is coupled to the BMC via the communication interface.

8. The system of claim 7, wherein the BMC controls discharging of the high efficient battery system by sending the discharging-enable command and the discharging-disable command to the MCU via the communication interface.

9. The system of claim 7, wherein the Oring MOSFET is directly connected to the battery pack and the MCU, and wherein the Oring MOSFET is connected to a DC/DC converter of the system.

10. The system of claim 7, wherein the instructions, when executed by the processor, cause the system to perform operations comprising:
    in an event that the PSU behaves abnormally, generating the discharging-enable command to enable the high efficient battery system to discharge power to the system.

11. The system of claim 7, wherein the instructions, when executed by the processor, cause the system to perform operations comprising:

in an event that both the AC power supply and the PSU are okay, generating a charging-enable command to enable the high efficient battery system to be charged by the PSU.

12. The system of claim 11, wherein the instructions, when executed by the processor, cause the system to perform operations comprising:

in an event that an output voltage of the high efficient battery system is equal or above a threshold high value, generating a charging-disable command to disable the high efficient battery system from being further charged by the PSU.

13. A non-transitory computer-readable medium storing instructions that, when executed by at least one processor of a system, cause the system to perform operations enabling charging and discharging a high efficient battery system, comprising:

receiving, at a base board controller (BMC) of the system, status information of an AC power supply and a power supply unit (PSU) of the system;

in an event that either the AC power supply or the PSU fails, generating a discharging-enable command to enable the high efficient battery system to discharge power to the system;

receiving status information of the high efficient battery system via a communication interface; and in an event that an output voltage of the high efficient battery system is equal or below a threshold low value, generating a discharging-disable command to disable the high efficient battery system from further discharging power to the system;

wherein the high efficient battery system comprises a microcontroller unit (MCU), a battery charger, a battery pack, and an Oring MOSFET, wherein the high efficient battery system does not include a discharging DC/DC converter; and wherein the battery charger is connected to an output of the PSU, and wherein the MCU is coupled to the BMC via the communication interface.

14. The non-transitory computer-readable storage medium of claim 13, wherein the instructions when executed further cause the system to perform operations comprising:

in an event that the PSU behaves abnormally, generating the discharging-enable command to enable the high efficient battery system to discharge power to the system.

15. The non-transitory computer-readable storage medium of claim 13, wherein the instructions when executed further cause the system to perform operations comprising:

in an event that both the AC power supply and the PSU are okay, generating a charging-enable command to enable the high efficient battery system to be charged by the PSU.

16. The non-transitory computer-readable storage medium of claim 15, wherein the instructions when executed further cause the system to perform operations comprising:

in an event that an output voltage of the high efficient battery system is equal or above a threshold high value, generating a charging-disable command to disable the high efficient battery system from being further charged by the PSU.

* * * * *